United States Patent [19]
Arthur et al.

[11] Patent Number: 5,415,700
[45] Date of Patent: May 16, 1995

[54] CONCRETE SOLAR CELL

[75] Inventors: John R. Arthur, Corvallis; Robert K. Graupner, Portland; Tyrus K. Monson, Corvallis; James A. Van Vechten, Corvallis; Ernest G. Wolff, Corvallis, all of Oreg.

[73] Assignee: State of Oregon, acting by and through the State Board of Higher Education on behalf of Oregon State University, Corvallis, Oreg.

[21] Appl. No.: 166,307

[22] Filed: Dec. 10, 1993

[51] Int. Cl.⁶ ............... H01L 31/06; H01L 31/0384; H01L 31/18

[52] U.S. Cl. .................... 136/250; 437/2; 437/4; 437/134; 437/137

[58] Field of Search ............ 136/250; 437/2–5, 437/134, 137

[56] References Cited

U.S. PATENT DOCUMENTS

| | | | |
|---|---|---|---|
| 2,904,613 | 9/1959 | Paradise | 136/250 |
| 3,038,952 | 6/1962 | Ralph | 437/2 |
| 3,480,818 | 11/1969 | TeVelde | 136/250 |
| 3,615,854 | 10/1971 | Aten | 136/250 |
| 4,021,323 | 5/1977 | Kilby et al. | 204/129 |
| 4,353,746 | 10/1982 | Birchall et al. | 106/89 |
| 4,353,747 | 10/1982 | Birchall et al. | 106/89 |
| 4,353,748 | 10/1982 | Birchall et al. | 106/89 |
| 4,363,667 | 12/1982 | Birchall et al. | 106/90 |
| 4,410,366 | 10/1983 | Birchall et al. | 106/90 |
| 4,514,580 | 4/1985 | Bartlett | 136/250 |
| 4,521,640 | 6/1985 | Levine | 136/250 |
| 4,614,835 | 9/1986 | Carson et al. | 136/250 |
| 4,691,076 | 9/1987 | Levine et al. | 136/250 |
| 4,806,495 | 2/1989 | Levine et al. | 437/2 |
| 4,872,607 | 10/1989 | Jensen et al. | 228/180.1 |
| 4,917,752 | 4/1990 | Jensen et al. | 156/292 |
| 5,192,400 | 3/1993 | Parker et al. | 205/124 |

FOREIGN PATENT DOCUMENTS

| | | |
|---|---|---|
| 0021682 | 1/1981 | European Pat. Off. |
| 0055035 | 6/1982 | European Pat. Off. |

OTHER PUBLICATIONS

O. O. Popoola et al., "Microstructural and Microchemical Characterization of a Calcium Aluminate–Polymer Composite [MDF Cement]," Journal of the American Ceramic Society, 1991, pp. 1928–1933.

S. R. Tan, et al., "Advanced Materials From Hydraulic Cements," Phil. Trans. R. Soc. Lond., A 322, 1987, pp. 479–491.

J. D. Birchall, "Cement in the Context of New Materials for an Energy-Expensive Future," Phil. Trans. R. Soc. Lond., 1983, A 310, pp. 31–42.

J. D. Birchall, et al., "Flexural strength and porosity of cements," Macmillan Journals Ltd., Nature vol. 289, Jan. 1981, pp. 050388–050390.

J. D. Levine, et al., "Basic Properties of the Spheral Solar TM Cell," IEEE, CH2953, Aug. 1991, pp. 1045–1048.

Primary Examiner—Aaron Weisstuch
Attorney, Agent, or Firm—Stoel Rives Boley Jones & Grey

[57] ABSTRACT

An inexpensive, robust concrete solar cell (10) comprises a photovoltaic material embedded in and extending beyond the major surfaces (16 and 18) of a matrix layer (14). The matrix layer typically comprises a high strength, cementitious material, such as a macrodefect free cement. The photovoltaic material comprises particles (12) of high-resistivity single crystal silicon, typically ball milled from ingot sections unsuitable for slicing into silicon wafers. The ingot sections include unprecipitated dissolved oxygen that is electrically activated by a low temperature annealing process to produce n-type silicon, even in silicon crystals that include a p-type dopant. An aluminum sheet (28), positioned on the backside of the matrix layer, is briefly melted together with the silicon particles to produce a p-type aluminum-doped silicon region (22) that forms a pn junction with the n-type region (24) of the particle. The aluminum sheet also provides the electrical contact to the p-type regions. The front surface of the matrix layer, from which the n-portion of the silicon particle protrudes, is covered with a translucent indium tin oxide conductive layer (30) that provides electrical contacts to the n-portion of the pn junction and digitated electrode (32) for conducting current off the cell. A voltage is generated between the two conductive layers when light incident on the photovoltaic particle through the indium tin oxide conductive layer creates charge carriers.

24 Claims, 1 Drawing Sheet

CONCRETE SOLAR CELL

TECHNICAL FIELD

This invention relates to an economical, robust solar cell.

BACKGROUND OF THE INVENTION

Solar cells convert light into useful energy, such as electricity or chemical energy. The high cost of solar cells, however, has prevented them from competing with conventional devices for generating power. Solar cells have typically been limited to low power applications, such as calculators, or niche applications, such as powering spacecraft, buoys, or other remote equipment.

Solar cells are typically constructed by forming a pn junction on a wafer of single crystal, electronic grade semiconductor silicon. The pn junction is typically formed parallel to the major surfaces of the silicon wafer. One side of the pn junction is electrically contacted by a conductor on the back surface of the solar cell, while the other side of the pn junction is contacted by a metallic grid on the front surface of the solar cell. Light incident on the cell creates electron-hole pairs that cause a voltage difference between the conductor on the back surface of the cell and the conductive grid on the front surface of the cell. Because such cells require electronic grade semiconductor silicon, they are expensive to manufacture. Such cells are relatively fragile and typically require mounting in a protective enclosure having a cover of a translucent material, i.e., a material that transmits a portion of the incident light.

Another type of solar cell that is constructed from spheres of metallic grade silicon is described in Levine, et al., "Basic Properties of the Spheral Solar TM Cell," *Proceedings of the Twenty Second IEEE Photovoltaic Conference*, Vol. 2, pp. 1045–48 (1991). Spheres of metallic grade silicon somewhat smaller than 1.0 mm in diameter and including a p-type dopant are purified, and an outer shell of each sphere is doped with an n-type material to form a pn junction. The spheres are bonded to a flexible aluminum foil, and electrical contacts are formed between the aluminum and the outer n-type shell. The spheres are etched to allow formation of an electrical contact to the inner p-type material. Although such cells are purportedly cheaper to produce than cells using wafers of electronic grade semiconductor silicon, the manufacture of such cells is complex. Furthermore, such cells, like previous cells, are relatively fragile and must be mounted in a protective module having a translucent glass or polymer superstrate.

Another type of solar cell uses silicon crystals embedded in a frit glass insulator, surrounded by clear hydrobromic acid. The voltage across the silicon crystals causes an electrochemical reaction that produces gaseous hydrogen, liquid bromine, and heat. The solar energy is thus stored as chemical energy in the hydrogen and bromine, which can be used in a fuel cell. McKee, et al., "Development and Evaluation of the Texas Instruments Solar Energy System," *16th IEEE PVSC Proceedings*, p. 257 (1982).

SUMMARY OF THE INVENTION

An object of the present invention is, therefore, to inexpensively convert light into a useful energy source. Another object of this invention is to produce an economical, large surface area solar cell for converting solar radiation into electricity.

A further object of this invention is to produce such a solar cell that is sufficiently robust to function with little or no maintenance for extended periods in outdoor environments.

Yet another object of this invention is to reduce the cost of disposing of scrap silicon produced during the manufacturing of silicon wafers.

The present invention comprises an apparatus for converting light into useable energy and a method for manufacturing the apparatus. Particles of a photovoltaic material are embedded in and extend beyond the major surfaces of a dielectric matrix, such as a high strength cementitious material. Light incident on the photovoltaic material generates charge carriers that travel to the portion of the photovoltaic particles extending beyond the dielectric matrix layer, where a voltage is produced. Applicants refer to the combination of photovoltaic particles with a cementitious matrix as a "concrete solar cell."

In a preferred embodiment, the photovoltaic particles comprise single crystal silicon. The silicon particles can be provided, for example, by comminuting high-resistivity by-products of silicon wafer production, such as ingot ends that are unsuitable for wafer production. Silicon particles that are not composed of an n-type material are annealed to electrically activate dissolved oxygen to convert the silicon to an n-type material.

The dielectric matrix material is typically a rigid, weather-resistant material, such as a high strength cement, with a macrodefect free cement ("MDFC") being the preferred material.

An aluminum sheet is positioned on one side of the dielectric matrix layer and contacts the silicon particles that extend beyond the layer. The aluminum and n-type silicon are melted together at the interface using the 577° C. eutectic process and resolidified, leaving a portion of the silicon doped with aluminum atoms to create a p-type region in each n-type particle, thereby forming a pn junction and electrical contacts between the aluminum sheet and the p-type region. The front side of the dielectric matrix layer, from which the n-type portion of the silicon particles protrude, is covered with a translucent conductive layer, such as an indium tin oxide ("ITO") layer, that provides electrical contacts to the n-type portion. A digitated, metallic grid may be added to reduce the sheet resistance of the front surface. A protective layer, such as a translucent MDFC layer may be added over the ITO layer and metallic grid. The invention can also be made using other junction types, such as a Schottky barrier junction, instead of a pn junction. The invention can also be used as part of an electrochemical cell.

Large area, robust photovoltaic panels can be constructed, for example, as shingles for placement on the roofs or sides of structures or on concrete railroad ties.

Additional objects and advantages of the present invention will be apparent from the following detailed description of a preferred embodiment thereof, which proceeds with reference to the accompanying drawings.

DETAILED DESCRIPTION OF PREFERRED EMBODIMENTS

Figure 1:
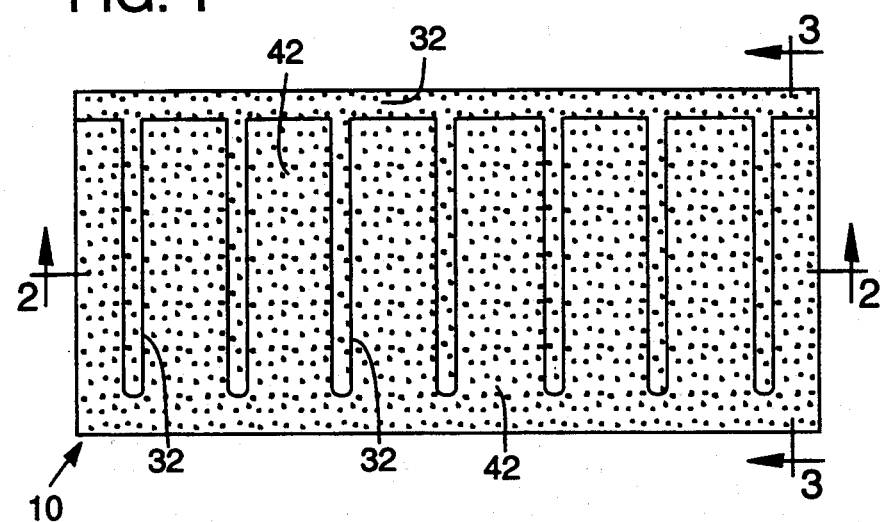
FIG. 1 is a plan view of a solar cell of the present invention.
Figure 3:
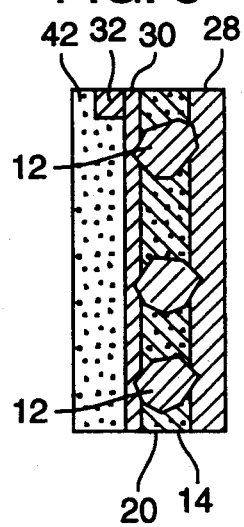
FIGS. 2 and 3 are sectional views taken along respective lines 2—2 and 3—3 of FIG. 1.
Figure 2:
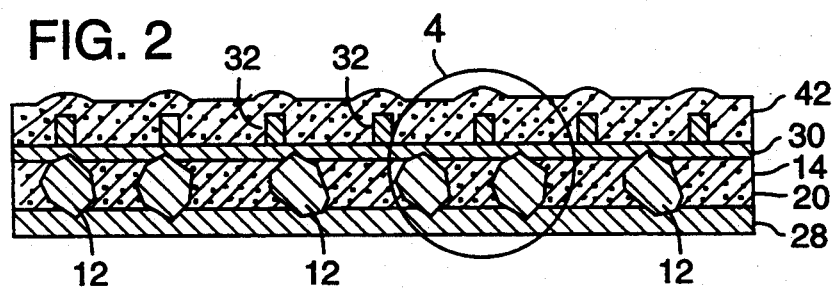
Figure 4:
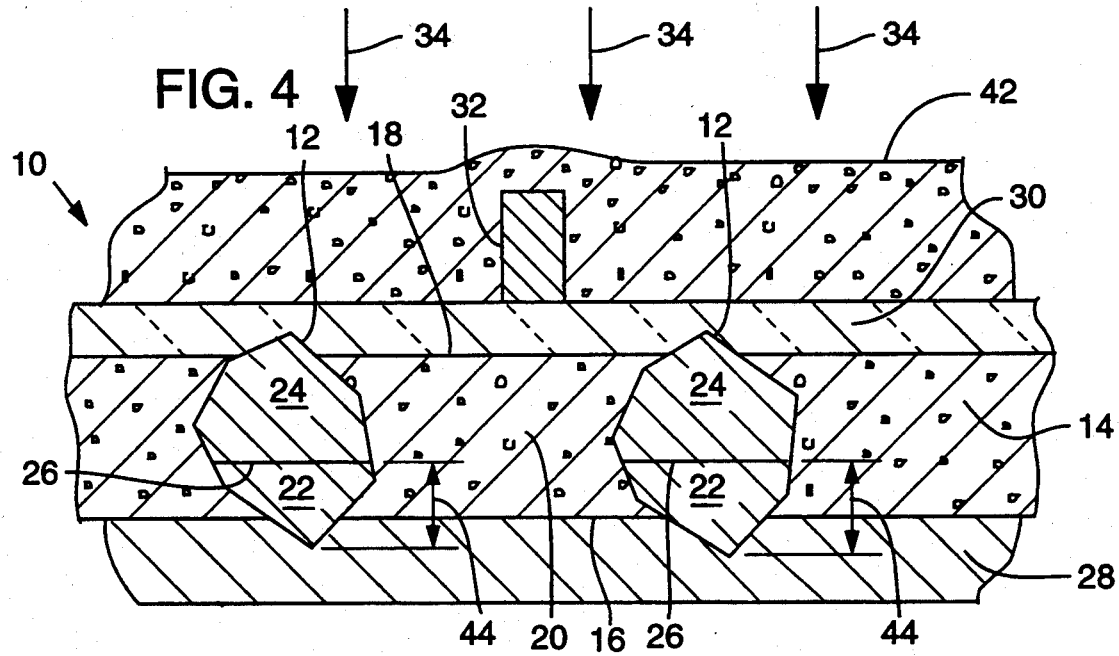
FIG. 4 is an enlarged, fragmentary view of the area labelled "4" of FIG. 2.

FIGS. 1-4 show a photovoltaic cell 10 that represents a preferred embodiment of a solar cell of the present invention. Photovoltaic cell 10 comprises photovoltaic particles 12 embedded in a dielectric matrix layer 14 having first and second major surfaces 16 and 18. Photovoltaic particles 12 and matrix layer 14 together form a concrete layer 20.

Each photovoltaic particle 12 includes a portion 22 of a p-type material and a portion 24 of an n-type material that together form a pn junction 26 at their interface and extend beyond major surfaces 16 and 18, respectively, to electrically contact a conductive layer 28 and a translucent conductive layer 30, respectively. A digitated electrode 32 positioned on translucent conductive layer 30 reduces the effective electrical sheet resistance of translucent conductive layer 30. Photovoltaic particles 12 and the various layers shown in the figures are exaggerated for clarity.

Light 34 incident on photovoltaic particle 12 and having energy greater than the band gap energy of the photovoltaic material comprising particle 12 passes through translucent conductive layer 30 and creates in photovoltaic particle 12 charge carriers, i.e., a conduction band electron and a valence band hole. An electric field within the pn junction, known in the art as the "built-in field," causes the electrons to move toward translucent conductive layer 30 and causes the holes to move toward conductive layer 28, thereby producing a voltage between conductive layers 28 and 30 that can be used to do work such as driving an electrical load or an electrochemical cell.

Matrix layer 14 is preferably composed of a high flexural strength, i.e., greater than 10 MPa, cement, such as a macrodefect free cement ("MDFC"). An MDFC is a cement that is exceptionally strong because, unlike ordinary cement, it contains essentially no large voids. For example, an MDFC may contain less than 2 percent voids by volume, with essentially no voids larger than 15 μm. Such large voids considerably weaken normal cement. The flexural strength of MDFC is, therefore, two orders of magnitude greater than that of normal cement, and its fracture energy is five orders of magnitude greater than that of ordinary cement. MDFC can be formed from many cementitious materials by carefully controlling the grain size, using a high shear mixer that deflocutates the grains, lubricating the particles with a water soluble organic polymer, and casting or calendering the cement at moderate pressures of between approximately 5 MPa and 50 MPa. The proportion of water in the MDFC composition is typically less than 25 percent, and preferably less than 12 percent, by weight, although the amount of water should not be so low that a plastic dough-like shapeable cementitious composition cannot be formed.

A preferred MDFC, as described in "Microstructural and Microchemical Characterization of a Calcium Aluminate-Polymer Composite (MDF Cement)," Popoola, et al., 74 J. Am. Ceramic Soc., pp. 1928-33 (1991), includes calcium aluminate cement, poly(vinyl alcohol/acetate), glycerine plasticizer, and distilled water. The poly(vinyl alcohol/acetate) may be 79.3 mol % hydrolyzed with a 1,700 unit degree of polymerization and a medium particle size of 12 μm. Photovoltaic particles 12 may be added to the cement dough before calendering into a layer preferably between 50 μm and 100 μm in thickness, depending upon the average dimensions of the photovoltaic particles 12. Thicker layers, such as layers of 400 μm in thickness, are sturdier and easier to produce but produce a less efficient photovoltaic cell 10. Other high strength cements, such as a portland- or pozzolanic-type cement, can also be used to embed photovoltaic particles 12 in the construction of photovoltaic cell 10.

Adding photovoltaic particles 12 to the cement before it is processed in the high shear mixer that deflocutates the cement grains produces a cement having good mechanical strength but may damage the photovoltaic particles 12. Adding photovoltaic particles 12 to the cement in a low force mixer after it has been deflocutated is less likely to damage photovoltaic particles 12 but may introduce voids, which produces a weaker cement, and adversely affects the setting time. Alternatively, photovoltaic particles 12 can be distributed onto conductive layer 28 and then an uncured MDFC layer 14 can be calendered onto photovoltaic particles 12 and conductive layer 28.

Calendering is performed preferably using hard rubber rollers that compress the cement paste and leave the ends of photovoltaic particles 12 extending slightly beyond the cement paste. Calendering may also be performed using pliable sheets of plastic or rubber. The calendering scrubs the top surface of photovoltaic particles 12 free of both oxide and cement and drives photovoltaic particles 12 into conducting layer 28 with sufficient force to break the insulating oxide layers on the photovoltaic particles 12 and conductive layer 28, which may comprise, for example, an aluminum foil. In some cases, however, it may be desirable to improve the electrical connection between particles 12 and conductive layer 28 by performing an additional cleaning step to remove an insulating layer of cement from the ends of photovoltaic particles 12.

An efficient photovoltaic cell 10 has a large proportion of the volume of concrete layer 20 comprised of photovoltaic particles 12. Too large a volume proportion of photovoltaic particles 12 would, however, reduce the mechanical strength of photovoltaic cell 10 and increase the probability of undesirable electrical contacts between different photovoltaic particles 12. A surface area of 35 percent photovoltaic particles 12 has been attained while maintaining a sufficiently strong photovoltaic cell 10.

The characteristics of MDFC make it very suitable for use in photovoltaic cell 10. MDFC is translucent, electrically insulating, and can be cast into sheets as thin as 20 μm. It bonds with silicon photovoltaic particles and with aluminum conductive layers. It is tough, strong, essentially nonporous, and water resistant and can withstand a wide range of environmental temperatures. The relative dielectric constant of calcium aluminum-based MDFC is typically between 7 and 9, which is less than the 11.8 relative dielectric constant of silicon. This difference in dielectric constants results in light being refracted from the MDFC into the silicon and light from within the silicon being refracted back into the silicon. The MDFC thus acts as an antireflection coating to enhance the efficiency of photovoltaic cell 10. Other types of MDFC can have lower dielectric constants, and thus would perform this function even better.

A photovoltaic cell 10 composed of MDFC has sufficient structural strength and is sufficiently robust that it can be used on the sides or roofs of buildings without a protective structure and cover glass. However, an optional translucent protective layer 42 of thin MDFC can be applied as a protective, antireflective coating over digitated electrodes 32 and translucent conductive layer 30 to provide further environmental protection for photovoltaic cell 10. An additional protective layer (not shown) can also be applied over conductive layer 28.

Photovoltaic particles 12 are high-resistivity (greater than 25 m$\Omega$-cm) n-type semiconductors when they are embedded into MDFC layer 14. The particles can be made from high-resistivity semiconductor silicon doped with n-type electron donor impurities, such as phosphorus, arsenic, or antimony. The particles can also be made from semiconductor silicon that is undoped or doped with p-type, electron acceptor impurities by electrically activating dissolved oxygen in the silicon to change the silicon to n-type. The oxygen is electrically activated by annealing, typically between 425° C. and 475° C., to move oxygen atoms from interstitial positions to lattice sites where they can donate valence band electrons. In a typical Czochralski-grown silicon crystal, annealing can activate approximately $3 \times 10^{16}$ atoms per cm$^3$ of oxygen, which is a sufficient concentration to change high-resistivity p-type silicon into high-resistivity n-type silicon.

Photovoltaic particles 12 can be formed by comminuting scrap sections of ingots grown for producing silicon wafers to be used in the manufacture of integrated circuits and from silicon remaining in the growing crucible after an ingot is grown. Ingot sections such as the seed and tail ends that are unsuitable for slicing into wafers are suitable for use in photovoltaic cell 10 of the present invention. Photovoltaic particles 12 are preferably milled to an octahedral shape having an average particle size of 50 $\mu$m to 100 $\mu$m using a ball mill and sieves. An average grain size of 50 $\mu$m would produce a more efficient photovoltaic cell 10, but such a cell would be more difficult to produce than a photovoltaic cell 10 having a larger grain size. The use of ball mills and sieves for producing particles of uniform size is well known in the powder metallurgy art. Approximately 65 percent of the silicon produced in the United States is of a high-resistivity type suitable for such use. High resistivity p-type scrap silicon is usable but must be procured before the dissolved oxygen is precipitated, so the oxygen is available to be electrically activated by annealing to convert the p-type scrap to an n-type material as described above. The present invention thus provides a beneficial use for scrap material that is a currently a costly waste disposal problem for the silicon industry.

Milling photovoltaic particles 12 from larger crystals of semiconductor silicon can cause crystal defects in photovoltaic particles 12. Such defects cause high surface recombination velocities and low minority carrier lifetimes that reduce the efficiency of photovoltaic cell 10.

The amount of crystal structure damage can be reduced by adding a lubricant during the milling process to reduce the energy of comminution. Suitable lubricants include those typically used in the slicing operation of silicon wafer manufacturing. Other methods also believed to be useable for reducing the crystal structure damage include annealing the photovoltaic particles 12 prior to casting them into MDFC layer 14 and etching photovoltaic particles 12 to enhance stable crystal facets and passivate dislocations.

Another technique that may be useful for improving minority carrier lifetimes and surface recombination velocity includes growing an oxide layer on photovoltaic particles 12 and then heating them to approximately 1,000° C. in the presence of lime to convert a portion of the oxide to calciated silica, thereby passivating dislocations. This method may also enhance the mechanical properties of cell 10 by increasing the adhesive between photovoltaic cell 10 and the MDFC material. The surface recombination velocity and minority carrier lifetime may also be improved by forming an n-type layer on photovoltaic particles 12 using chemical vapor deposition or organo-metallic chemical vapor deposition. The surface of the photovoltaic particles 12 may also be passivated by reacting with the cement, with the degree of passivation being determined by the type of cement used.

Photovoltaic particles 12 can also be formed from electronic grade polycrystalline silicon or from metallurgical grade silicon as described by Jules D. Levine, et al., in "Basic Properties of the Spheral Solar TM Cell," *Proceedings of the Twenty Second IEEE Photovoltaic Conference,* Vol. 2, pp. 1045–48 (1991) and U.S. Pat. No. 5,069,740 for "Production of Semiconductor Grade Silicon Spheres from Metallurgical Grade Silicon Particles." Such spheres have diameters on the order of a millimeter and require, therefore, a correspondingly thicker MDFC layer 14. Other photovoltaic materials, such as silicon carbide and gallium phosphide, can be used in photovoltaic particles 12. The starting material for creating photovoltaic particles 12 can be varied depending on the price and availability of the various raw materials.

P-type portions 22 of photovoltaic particles 12 are preferably formed simultaneously with the formation of electrical connections between photovoltaic particles 12 and conductive layer 28. Conductive layer 28 typically comprises an aluminum foil. The aluminum foil and the silicon of photovoltaic particles 12 are briefly melted together at their interface by using, for example, a rapid thermal annealer or by applying a high voltage between the aluminum sheet and a tin-coated calendering roller on the opposite side of the MDFC layer 14. The eutectic reaction at 577° C. results in a concentration of approximately $3 \times 10^{18}$ aluminum atoms per cm$^3$ in the resolidified silicon. Because aluminum is an electron acceptor, the aluminum doped silicon is a p-type semiconductor. The interface between aluminum-doped p-type region 22 and the remaining n-type region 24 of photovoltaic particles 12 results in a pn junction 26 that provides an internal electric field that drives the photo-induced charge carriers to conductors 28 and 30.

The depth of pn junction 26 is controlled by controlling the energy applied to melt the silicon-aluminum interface. Alternatively, the depth of the pn junction 26 can be controlled by limiting the quantity of aluminum available, for example, by vacuum depositing a thin layer of aluminum onto MDFC layer 14 before melting the aluminum-silicon interface. After the pn junction is formed from the thin aluminum layer, an additional conductor, such as an aluminum foil, is applied onto major surface 16 to increase the cross-sectional area and reduce the sheet resistance of conductive layer 28. The aluminum foil can be bonded to the deposited aluminum by heating both layers above the 577° C. aluminum-silicon eutectic temperature. A preferred conductive layer 28 has a thickness of approximately 100-150 μm. P-type region 22 extends into photovoltaic particle 12 a distance 44, preferably equal to the lesser of approximately 10 μm or half of the diameter of photovoltaic particle 12.

Another method of controlling the depth of pn junction 26 entails depositing a layer of aluminum approximately 2 μm in thickness onto a conductive substrate, such as a steel backing sheet, that has a melting temperature significantly higher than the 577° C. aluminum-silicon eutectic temperature. Upon heating to 577° C., the aluminum at the silicon interface melts to form the pn junctions and electrical contacts. The steel remains solid, essentially soldered to the silicon by the aluminum. Because of the detrimental effect of heavy metal atoms, such as iron, on minority carrier lifetimes in silicon, temperatures during formation of the pn junctions should remain low to preclude significant diffusion of atoms from the metallic backing sheet into the silicon.

If photovoltaic particles 12 are not mixed into the matrix material before calendering, they can be deposited directly onto conductive layer 28. The matrix material can then be deposited onto the photovoltaic particles 12 and conductive layer 28 to form concrete layer 20. For example, silicon particles can be distributed on an aluminum foil, and then a MDFC can be calendered onto the aluminum foil using a conductive, e.g., tin-coated, roller having a sufficiently high voltage applied between the tin roller and the aluminum foil to weld the photovoltaic particles 12 to the aluminum foil. During the weld, the p-type region would be formed by the eutectic process and the electrical contact between the aluminum and the silicon would be established. Any tin deposited by the roller onto the MDFC or the silicon would simply become a part of an indium tin oxide conductive layer 30.

Alternatively, the photovoltaic particles 12 can be deposited onto conductive layer 28 and pn junctions 26 could be formed, for example, by rapid thermal annealing. The matrix material is then deposited onto conductive layer 28, for example, by calendering with hard rubber rollers and cured to form matrix layer 14. Whether matrix layer 14 is deposited before or after pn junctions 26 are formed depends in part upon the ability of the matrix material to withstand without damage the short period at 577° C. required to form pn junctions 26.

To reduce deterioration of the matrix material during junction formation, the temperature required for junction formation can be reduced by adding one or more additional elements at the photovoltaic particle-conductive layer interface. For example, an additional alloying material, such as tin, gallium, or zinc, can be added to aluminum at the interface between conductive layer 28 and photovoltaic particles 12. Such three-component systems can have a melting temperature lower than the silicon-aluminum binary system. The alloying material can be added, for example, by evaporating it onto major surface 16 or by depositing it onto or incorporating it into a metallic foil used to form conductive layer 28. An alloying material can be chosen for its effects as a dopant, as well as its ability to lower junction formation temperature. Binary systems other than the silicon aluminum system could also be used to form the junctions. For example, antimony can be used to form np junctions in p-type silicon particles.

If matrix layer 14 is formed from a cementitious material other than a MDFC, it will typically have pores that can fill with a conductive material during processing and cause short circuits between conductive layers 28 and 30. Such short circuits can be prevented by filling the pores using an electrodeposition process and then oxidizing or anodizing the exposed top surface of the deposited material to form an insulating layer. Short circuits through voids in concrete layer 20 caused by imperfect deposition of the matrix material can be similarly prevented. Shorted photovoltaic particles 12, i.e., those in which both p-type region 22 and n-type region 24 contact the same conductive layer 28 or 30, can be isolated by an anodization process, similar to that described in U.S. Pat. No. 5,192,400 to Parker et al. for "Method of Isolating Shorted Silicon Spheres." The resistivity between conductive layers 28 and 30 across concrete layer 20 is preferably greater than 250 $\Omega/cm^2$ to ensure a sufficiently small leakage current.

After the pn junctions are formed, translucent conductive layer 30 is formed, for example, by depositing a layer of indium tin oxide, preferably approximately 5 μm in thickness, onto major surface 18. Metallic digitated electrode 32, deposited on translucent conductive layer 30 by known techniques, exhibits lower resistivity than the indium tin oxide of translucent conductive layer 30 and, therefore, reduces the electrical resistance between photovoltaic particles 12 and an electrical load (not shown) driven by photovoltaic cell 10 by effectively reducing the sheet resistance of translucent conductive layer 30. The area covered by digitated electrodes 32 is sufficiently small so that the increase in efficiency caused by the decreased electrical resistivity is greater than the decrease in efficiency caused by blocking some of the incident light 34. Optionally, protective MDFC layer 42 can be applied over digitated electrode 32 and translucent conductive layer 30, and a second protective MDFC layer can be applied over conductive layer 28.

Although photovoltaic cell 10 could be produced as wide strips with arbitrary lengths, such a configuration would result in a low voltage, large current device. It would be preferable to configure multiple panels of photovoltaic cell 10 in a series to increase the voltage output. One method of series connecting photovoltaic cell 10 would be to assemble them as roofing shingles, with conductive layer 28 of each course electrically connected to the conductive layer 30 of the subsequent course, so that the voltage difference between each course and the first course increases with each subsequent course.

Photovoltaic cell 10 has sufficient structural strength and is sufficiently robust that it can be used on the outside of structures, such as concrete buildings, concrete railroad ties, and roofs, with no cover glass or other support structures. The rigidity of a typical photovoltaic cell 10 enhances its usefulness as a building material when compared to prior art, such as aluminum foil-matrix cells. Photovoltaic cell 10 is, therefore, inexpensive to install and requires little or no maintenance. Care must be taken, however, when photovoltaic cell 10 is installed onto structures of conventional concrete that the water content of the conventional concrete does not corrode the aluminum of photovoltaic cell 10. This can be accomplished by placing a layer of MDFC between aluminum and the conventional concrete.

It will be obvious that many changes may be made to the above-described details of the invention without departing from the underlying principles thereof. For example, pn junction 26 can be formed by methods other than those described. A photovoltaic cell can also be constructed using other junction types, such as a Schottky barrier junction, a heterojunction, or a metal-insulator-semiconductor junction, in place of a pn junction. A Schottky barrier junction can be formed, for example, at the interface between the silicon of a photovoltaic particle 12 and the indium tin oxide of a translucent conductive layer 30. An electrochemical or galvanic cell can also be constructed using the principles of the present invention. In such a cell, concrete layer 20 is immersed in a fluid that electrochemically stores energy from incident light 34. The scope of the present invention should, therefore, be determined only by the following claims.

We claim:

1. A concrete solar cell, comprising:
   a cementitious layer having first and second major surfaces;
   a photovoltaic material embedded in the cementitious layer and extending beyond the first and second major surfaces;
   a first electrically conductive material juxtaposed to the first major surface and electrically contacting the photovoltaic material; and
   a second electrically conductive material that transmits a portion of incident light, the second electrically conductive material being juxtaposed to the second major surface and electrically contacting the photovoltaic material.

2. The concrete solar cell of claim 1 in which the cementitious layer is of a calcium aluminate, Portland cement, or pozzolanic type.

3. The concrete solar cell of claim 1 in which the cementitious layer comprises a cementitious material having a flexural strength of greater than 10 MPa.

4. The concrete solar cell of claim 3 in which the cementitious layer comprises a macrodefect free cement material.

5. The concrete solar cell of claim 3 in which photovoltaic material includes silicon, silicon carbide, or gallium phosphide.

6. The concrete solar cell of claim 3 in which the photovoltaic material includes a pn junction.

7. The concrete solar cell of claim 3 in which the photovoltaic material includes a Schottky barrier junction.

8. The concrete solar cell of claim 1 in which some atoms from the first conductive material are dissolved in the photovoltaic material, thereby altering its electrical characteristics.

9. The concrete solar cell of claim 1 in which the photovoltaic material includes p-type and n-type semiconductor silicon forming a pn junction, the first conductive material includes aluminum, and the p-type material includes aluminum-doped silicon.

10. The concrete solar cell of claim 1 in which the first and second conductive materials comprise a fluid for electrochemically storing energy.

11. A method of manufacturing a concrete solar cell, comprising:
    providing particles of a photovoltaic material;
    embedding the particles of photovoltaic material in a cementitious layer so that the particles extend beyond major surfaces of the cement layer; and
    providing electrical contacts to the photovoltaic material.

12. The method of claim 11 in which embedding the particles in a cementitious layer includes embedding the particles in a layer of macrodefect free cement.

13. The method of claim 12 in which providing particles of a photovoltaic material includes comminuting photovoltaic materials to produce particles slightly larger than the thickness of the macrodefect free cement layer.

14. The method of claim 13 in which providing particles of a photovoltaic material includes increasing the minority carrier lifetime of said photovoltaic material.

15. The method of claim 14 in which increasing the minority carrier lifetime includes providing a lubricant to reduce dislocations while comminuting the photovoltaic material.

16. The method of claim 14 in which increasing the minority carrier lifetime includes annealing the particles.

17. The method of claim 14 in which increasing the minority carrier lifetime includes etching the particles.

18. The method of claim 14 in which increasing the minority carrier lifetime includes forming a layer on the particles.

19. The method of claim 11 in which embedding the particles in a macrodefect free cement layer includes calendering the cement layer.

20. The method of claim 11 in which providing electrical contacts to the photovoltaic material includes:
    contacting the material photovoltaic material with an alloying material to reduce the melting temperature of the photovoltaic material; and
    melting the photovoltaic material with the alloying material to change the electrical characteristics of the photovoltaic material.

21. The method of claim 20 in which the photovoltaic material includes silicon and the alloying material includes aluminum.

22. The method of claim 11 in which:
    providing particles of a photovoltaic material includes providing particles of semiconductor silicon;
    providing electrical contacts to the photovoltaic material includes forming an electrical contact with an aluminum conductive layer and forming a pn junction in the photovoltaic material by an aluminum-silicon eutectic process.

23. A method of forming a concrete solar cell, comprising:
    providing a high-resistivity p-type photovoltaic material;
    activating an electrically inactive material in the photovoltaic material to convert the p-type photovoltaic material to an n-type photovoltaic material;
    juxtaposing a layer of a second material to the surface of the photovoltaic material to form an interface between the photovoltaic material and the second material; and
    forming a pn junction within the photovoltaic material by melting and resolidifying the photovoltaic material and the second material at their interface, whereby atoms from the second material dope the photovoltaic material.

24. The method of claim 23 in which the photovoltaic material includes n-type silicon, the second material includes aluminum, and forming a pn junction includes a 577° C. aluminum-silicon eutectic process.

* * * * *